(12) United States Patent
Onoe

(10) Patent No.: US 7,019,987 B2
(45) Date of Patent: Mar. 28, 2006

(54) INVERTER

(75) Inventor: Makoto Onoe, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 138 days.

(21) Appl. No.: 10/452,047

(22) Filed: Jun. 3, 2003

(65) Prior Publication Data

US 2003/0223257 A1 Dec. 4, 2003

(30) Foreign Application Priority Data

Jun. 3, 2002 (JP) .................................. 2002-160960
Mar. 26, 2003 (JP) .................................. 2003-085777

(51) Int. Cl.
*H02M 3/335* (2006.01)
*H02M 3/24* (2006.01)

(52) U.S. Cl. ............................... 363/17; 363/71; 363/89

(58) Field of Classification Search .................. 363/65, 363/71, 37, 39, 40, 41, 89, 17, 19
See application file for complete search history.

(56) References Cited

U.S. PATENT DOCUMENTS

| | | | |
|---|---|---|---|
| 3,800,269 A | | 3/1974 | Palombella |
| 4,472,641 A | * | 9/1984 | Dickey et al. ................. 307/46 |
| 4,642,473 A | * | 2/1987 | Bryant ......................... 307/38 |
| 5,430,326 A | | 7/1995 | Miyashita |
| 5,576,940 A | * | 11/1996 | Steigerwald et al. .......... 363/17 |
| 5,617,293 A | | 4/1997 | Schulze et al. |
| 5,777,377 A | | 7/1998 | Gilmore |
| 5,989,057 A | | 11/1999 | Gerke et al. |
| 5,991,164 A | | 11/1999 | Saito et al. |
| 2001/0002875 A1 | | 6/2001 | Prabonnaud et al. |

FOREIGN PATENT DOCUMENTS

| | | |
|---|---|---|
| JP | 3-285570 | 12/1991 |
| JP | 08046231 | 2/1996 |
| JP | 11-318042 A | 11/1999 |
| JP | 2002016279 | 1/2002 |

* cited by examiner

*Primary Examiner*—Rajnikant B. Patel
(74) *Attorney, Agent, or Firm*—Birch, Stewart, Kolasch & Birch, LLP

(57) ABSTRACT

DC/DC converters arranged side by side have first output terminals conducting to one pole of capacitors for rectification, second output terminals conducting to the other pole of the capacitors, and connection terminals disposed next to the second output terminals. The first output terminals are connected together by an I-shaped bus bar of copper or the like fastened thereto with screws. The second output terminals are connected together by one linear portion of a U-shaped bus bar fastened thereto with screws. The connection terminals are connected together by the other linear portion of the U-shaped bus bar fastened thereto with screws. In this way, the resistances of the bus bars connected to both ends of the capacitors are made substantially equal, and thereby the voltages applied to the capacitors are made equal.

9 Claims, 12 Drawing Sheets

INVERTER

This nonprovisonal application claims priority under 35 U.S.C. § 119(a) on Patent Application No(s). 2002-160960 filed in JAPAN on Jun. 3, 2002 and 2003-085777 filed in JAPAN on Mar. 26, 2003, which is(are) herein incorporated by reference.

BACKGROUND OF THE INVENTION

1. Field of the Invention

The present invention relates to an inverter for converting the output of a direct-current power source such as a solar cell, fuel cell, rechargeable cell, or the like into alternating-current power for supply to equipment that needs it, and more particularly to an inverter including a DC/DC converter.

2. Description of the Prior Art

An inverter for a solar light power generation system converts the direct-current (DC) power generated by solar cells into alternating-current (AC) power having a commercial frequency by the use of a DC/AC converting means. The output of the inverter is supplied to an alternating-current load that is connected to a commercial power line so as to be extracted from the commercial power.

FIG. 16 is a block diagram showing an example of a conventional inverter. To the input side of the inverter 4, there are connected solar cell arrays 11, 12, and 13 in parallel, each composed of a plurality of solar cell panels 10 integrally held together in series. The output sides of the solar cell arrays 11, 12, and 13 are connected to a DC/AC conversion circuit 3 so that their outputs are converted into alternating-current power and then output to commercial power 5 by the DC/AC conversion circuit 3.

The solar cell arrays 11, 12, and 13 are installed on the roof of a house or the like, and therefore, depending on the shape and area of the roof, it is difficult to connect equal numbers of solar cell panels 10 in series in all of the solar cell arrays 11, 12, and 13. For this reason, a step-up circuit 2 is provided on the output side of the solar cell array 13 that has fewer cells connected in series so that all the voltages that are fed to the DC/AC conversion circuit 3 are equal. The step-up circuit 2 is incorporated in the inverter 4 as shown in FIG. 16, or is provided separately outside the inverter 4.

In recent years, research has been done on inverters having a DC/DC converter on the input side of a DC/AC conversion circuit 3. Here, the DC/DC converter follows the variation of the amount of sun light received in order to achieve maximum power point tracking control. This permits efficient conversion and output of the power generated.

Also proposed are systems that employ a combination of different types of direct-current power source such as solar cells, fuel sells, rechargeable cells, and the like. Different types of direct-current power source usually output different voltages, and such differences in voltage are generally cancelled by providing a DC/DC converter on the input side of a DC/AC conversion device.

In the inverter 4 configured as described above, when different numbers of cells are connected in series in different branches of the direct-current sources, it is necessary to provide, with reference to the direct-current source that has the largest number of cells connected in series, step-up circuits 2 in the other branches. The step-up circuit 2, however, has a fixed voltage step-up factor, and therefore its output voltage varies as the amount of sun light received varies, resulting in inefficient output.

For this reason, research is being done on inverters having, in each branch of direct-current power sources, a DC/DC converter that each performs maximum power point tracking control, instead of the step-up circuit 2. This configuration, however, makes the inverter large. This problem is encountered also when different types of direct-current power source such as solar cells, fuel sells, rechargeable cells, and the like are used in combination.

A DC/DC converter has a capacitor for rectification on the output side thereof, and outputs a voltage via output terminals respectively conducting to the two poles of the capacitor. The individual output terminals of one pole of a plurality of DC/DC converters are connected together to a common terminal of that pole by way of leads or the like; likewise, the individual output terminals of the other pole are connected together to a common terminal of that pole. The common terminals of the two poles are then connected to the input side of the DC/AC conversion circuit provided in the following stage.

Thus, the distance from the output terminals of one DC/DC converter to the common terminals is inevitably longer than the distance from the output terminals of another DC/DC converter connected in parallel therewith to the common terminals. As a result, the DC/DC converter that has the smaller lead resistance receives a larger voltage and thus has a shorter life time, leading to lower reliability of the inverter. Giving equal lengths to all the leads connecting the output terminals to the common terminals makes wiring complicated and necessitates extra space for wiring. This makes miniaturization of the inverter impossible.

Moreover, connecting the output terminals of a plurality of DC/DC converters to the common terminals by way of leads requires much trouble and time in assembly, and requires space for wiring. This makes miniaturization impossible, and makes the structure complicated. Likewise, connecting the ground terminals of the individual DC/DC converters together to one terminal by way of leads or the like to keep them at the same potential requires much trouble and time in assembly, makes miniaturization impossible, and makes the structure complicated.

Furthermore, arranging the circuit boards of the DC/DC converters in a plane makes the DC/DC converters large and thus makes the miniaturization of the inverter impossible. On the other hand, spatially arranging those circuit boards requires space for wiring between them, and thus likewise makes the miniaturization of the inverter impossible and in addition makes the structure complicated.

SUMMARY OF THE INVENTION

An object of the present invention is to provide an inverter that can be assembled with less trouble and time and can be miniaturized without lowering reliability.

To achieve the above object, according to the present invention, a plurality of DC/DC converters, each having a direct-current power source connected to the input side thereof, are arranged side by side, one pole of the capacitor provided at the output end of each DC/DC converter is connected to a first common terminal in such a way that the DC/DC converters have decreasingly long connection distances in order of their arrangement, and the other pole of the capacitor provided at the output end of each DC/DC converter is connected to a second common terminal in such a way that the DC/DC converters have increasingly long connection distances in order of their arrangement.

In this structure, the sum of the distance from one pole of the capacitor of a DC/DC converter to the first common terminal and the distance from the other pole of the capacitor of the same DC/DC converter to the second common terminal is equal among different DC/DC converters. This makes the voltages applied to the individual capacitors equal. Here, the output terminals of one DC/DC converter may be used as the first and second common terminals.

According to the present invention, in the inverter structured as described above, each DC/DC converter is provided with a first output terminal conducting to one pole of the capacitor so that, when the DC/DC converters are arranged side by side, their first output terminals are arranged in a line so as to be connected together by, for example, an I-shaped first conductor plate. Likewise, second output terminals conducting to the other pole are arranged in a line so as to be connected together by a second conducting plate, which is bent in U shape so as to be connected to connection terminals. As a result, the first output terminal and the connection terminal of the DC/DC converter disposed at an end serve as the first and second common terminals. This helps reduce the space required to connect leads to the individual DC/DC converters.

According to the present invention, each DC/DC converter has a circuit portion that is fitted to a circuit board by a fitting member such as with screws or by soldering, and the circuit board and the circuit portion conduct to each other by way of the fitting member. This helps omit connection between the circuit board and the circuit portion by a lead or the like.

According to the present invention, each DC/DC converter has a circuit portion that is fitted to a circuit board by a fitting member such as with screws or by soldering, and the circuit board or the circuit portion is formed by insert molding integrally with a terminal block having an input terminal and a ground terminal, a support portion, or the like.

According to the present invention, the ground terminals of each DC/DC converter are arranged on both sides of the input terminals thereof, and one ground terminal of one DC/DC converter is tied to the other ground terminal of the next DC/DC converter by a conductor plate. Moreover, the separation walls between the input terminals and the ground terminals are inclined, and this alleviates the bending of leads connected to the input terminals from a predetermined direction.

According to the present invention, individual DC/DC converters are provided with input terminals and ground terminals arranged respectively in two different lines parallel to the direction of their arrangement, and the ground terminals of adjacent DC/DC converters are tied together with a plate-shaped conductor plate.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
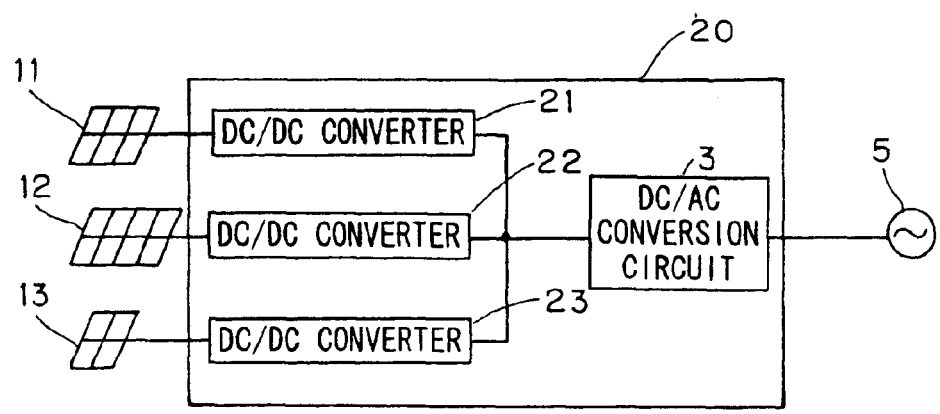
FIG. 1 is a block diagram showing the structure of the inverter of a first embodiment of the invention.
Figure 16:
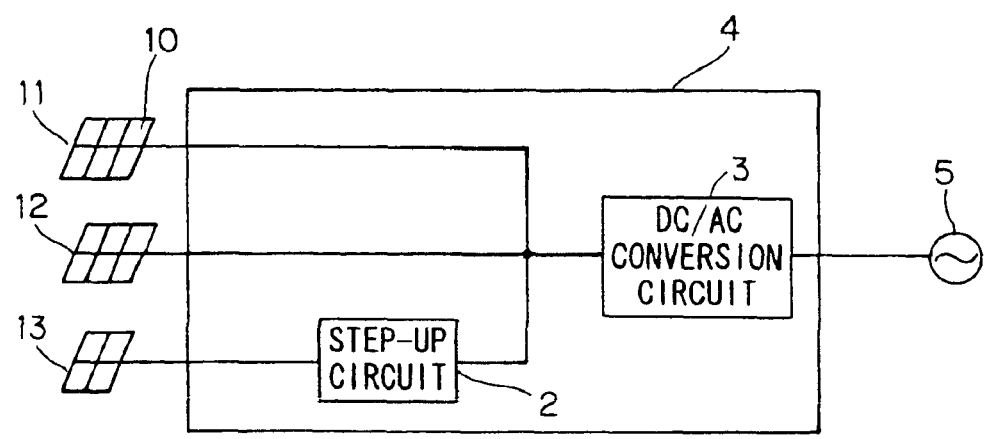
FIG. 16 is a block diagram showing the structure of a conventional inverter.

Hereinafter, embodiments of the present invention will be described with reference to the drawings. For convenience's sake, such components as are found also in the conventional example shown in FIG. 16 are identified with the same reference numerals. FIG. 1 is a block diagram showing the structure of the inverter for a solar light power generation system as a first embodiment of the invention. To the input side of the inverter 20, there are connected direct-current power sources composed of solar cell arrays 11, 12, and 13, each having a plurality of solar cell panels 10 held together integrally in series.

The solar cell arrays 11, 12, and 13 are connected to DC/DC converters 21, 22, and 23 respectively. The DC/DC converters 21, 22, and 23 are so configured as to follow the variation of the amount of sun light received in order to achieve maximum power point tracking control and thereby achieve efficient conversion and output of the power generated. The output sides of the DC/DC converters 21, 22, and 23 are connected to a DC/AC conversion circuit 3 so that their outputs are converted into alternating-current power and then output to commercial power 5 by the DC/AC conversion circuit 3.

The solar cell arrays 11, 12, and 13 are installed on the roof of a house or the like, and therefore, depending on the shape and area of the roof, it is difficult to connect equal numbers of solar cell panels 10 in series in all of the solar cell arrays 11, 12, and 13. For this reason, the DC/DC converters 21, 22, and 23 are so configured as to make equal all the voltages that are fed to the DC/AC conversion circuit 3.

Figure 2:
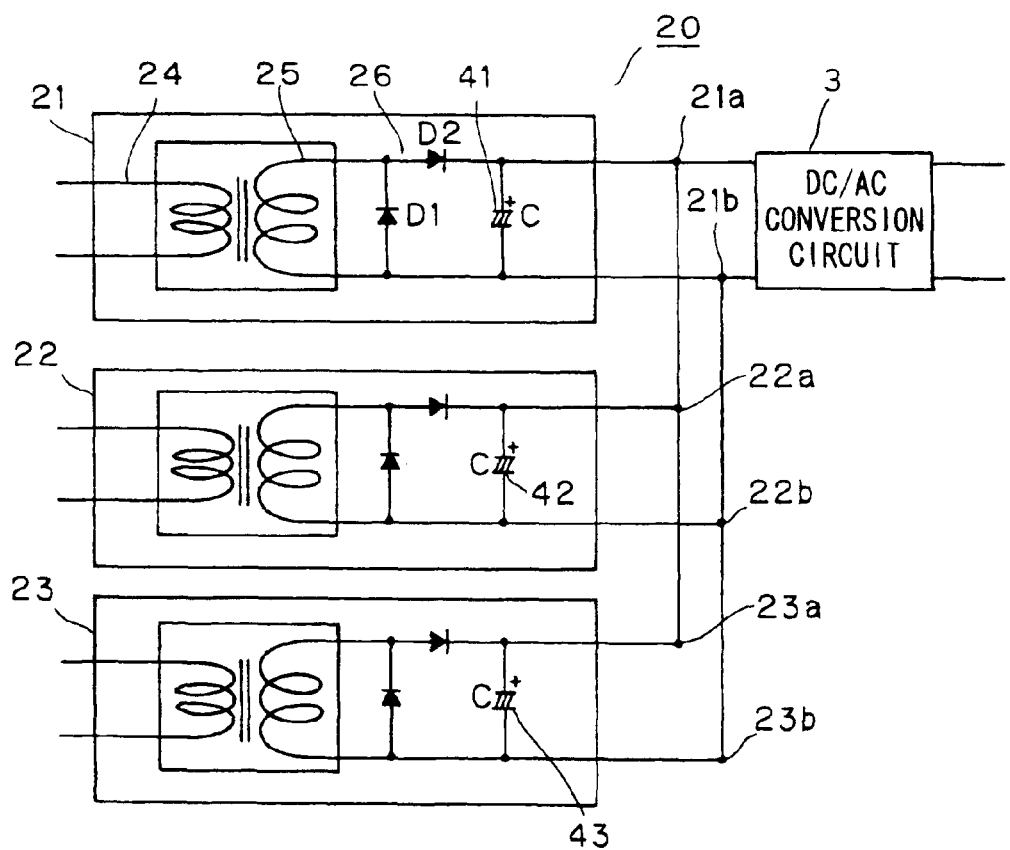
FIG. 2 is a circuit diagram of the inverter of the first embodiment.

FIG. 2 is a circuit diagram of the inverter 20. The DC/DC converters 21, 22, and 23 are configured identically. Specifically, in each of the DC/DC converters 21, 22, and 23, a primary coil 24 is provided on the input side by way of a switching circuit (not shown); a secondary coil 25 is provided so as to face the primary coil 24; a rectification circuit 26 composed of diodes D1 and D2 and an electrolytic capacitor C (41, 42, or 43) is connected to the secondary coil 25.

The two poles of the electrolytic capacitor 41 are respectively connected to the output terminals 21a and 21b of the DC/DC converter 21. The two poles of the electrolytic capacitor 42 are respectively connected to the output terminals 22a and 22b of the DC/DC converter 22. The two poles of the electrolytic capacitor 43 are respectively connected to the output terminals 23a and 23b of the DC/DC converter 23.

The output terminals 22a and 23a are connected to the output terminal 21a by bus bars 31 (see FIG. 3), which will be described later, and the output terminals 22b and 23b are connected to the output terminal 21b by bus bars 32 (see FIG. 3), which will be described later. The output terminals 21a and 21b are connected by leads 9 (see FIG. 3) to the input side of a DC/AC conversion circuit 3, which performs DC/AC conversion.

The voltages fed from the solar cell arrays 11, 12, and 13 to the DC/DC converters 21, 22, and 23 are converted into pulses by on/off operation of the switching circuits, and are then amplified by the primary and secondary coils 24 and 25. The voltages are then rectified into direct-current voltages by the rectification circuits 26. Thus, a direct-current voltage is fed from the output terminals 21a and 21b to the DC/AC conversion circuit 3.

Figure 3:
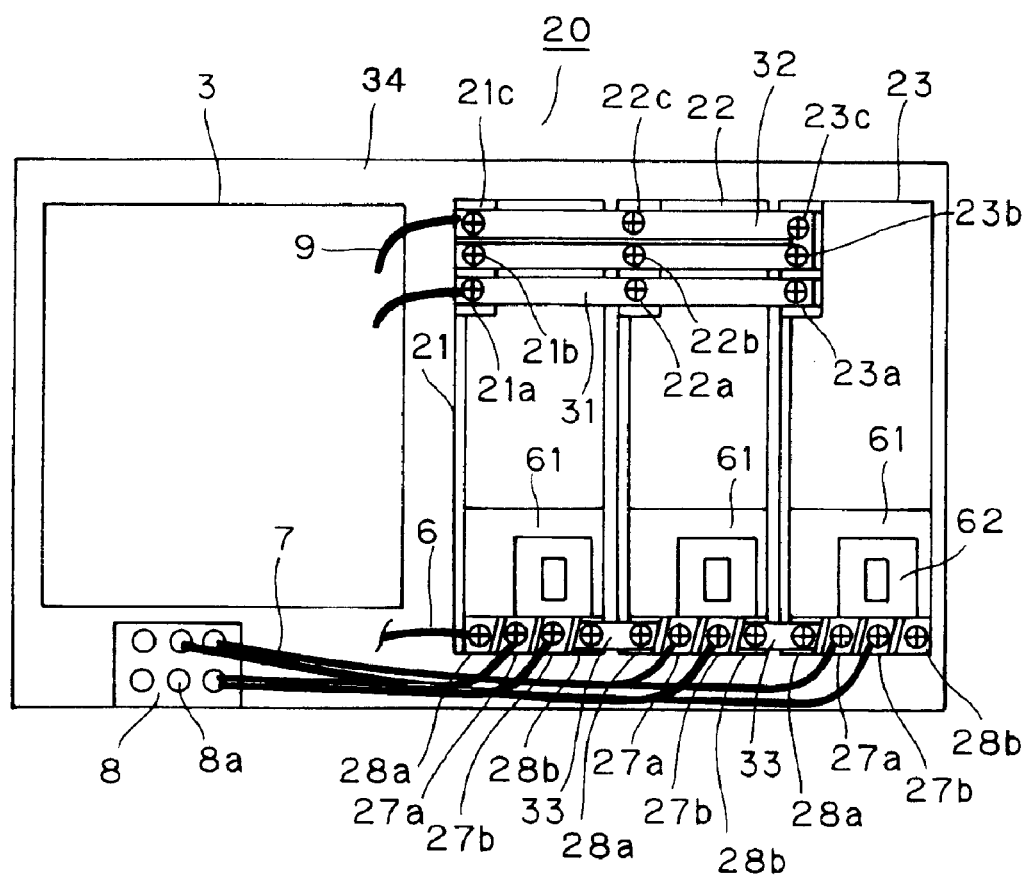
FIG. 3 is a top view of the inverter of the first embodiment.

FIG. 3 is a top view of the inverter 20. The inverter 20 has the DC/AC conversion circuit 3 arranged in one side of a chassis 34, and has the DC/DC converters 21, 22, and 23 arranged side by side in the other side of the chassis 34. Below the DC/AC conversion circuit 3 as seen in the figure, there is provided an input portion 8 having through holes 8a formed through the bottom surface of the chassis 34. Through the through holes 8a, leads 7 leading from the solar cell arrays 11, 12, and 13 run into the inverter 20.

Figure 4:
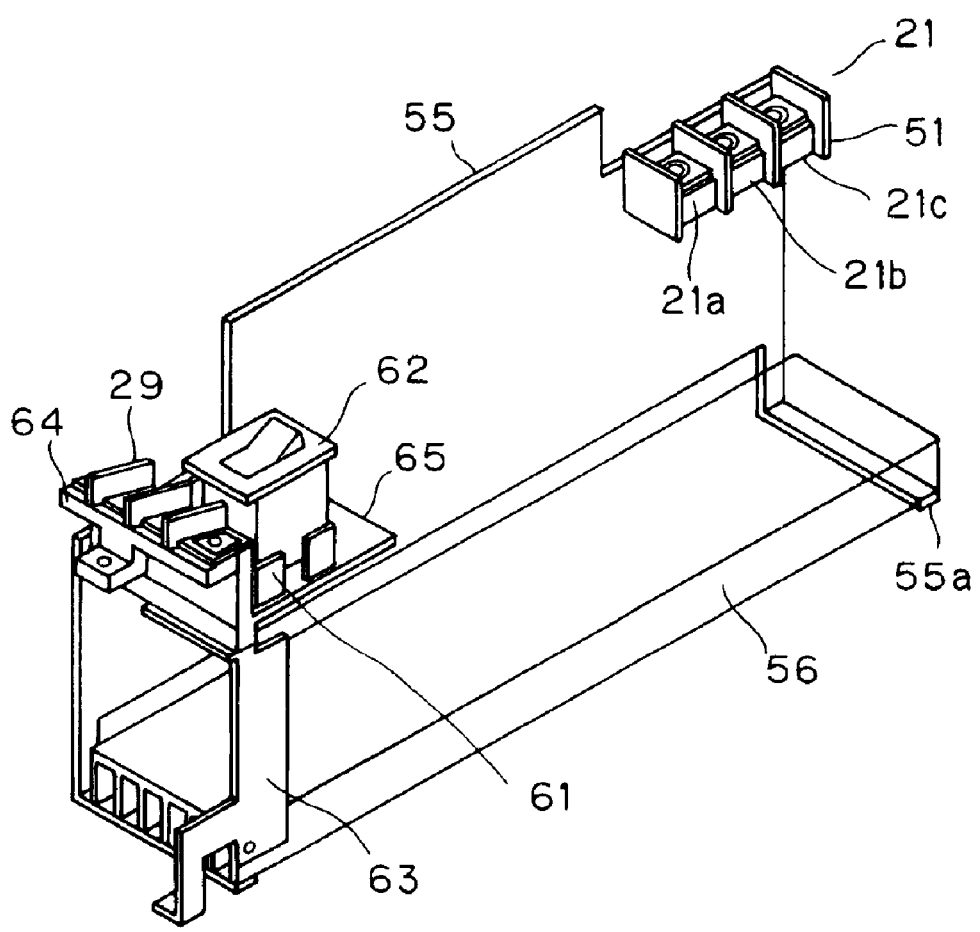
FIG. 4 is a perspective view of the DC/DC converter of the inverter of the first embodiment.

FIG. 4 is a perspective view of the DC/DC converter 21. The DC/DC converters 22 and 23 are structured identically to the DC/DC converter 21. The DC/DC converter 21 has a main circuit board 55 on which its circuit is formed, and, on the main circuit board 55, there are fitted an output terminal portion 51 having the output terminals 21a and 21b and an input terminal portion 61 having input terminals 27a and 27b (see FIG. 3).

Figure 5:
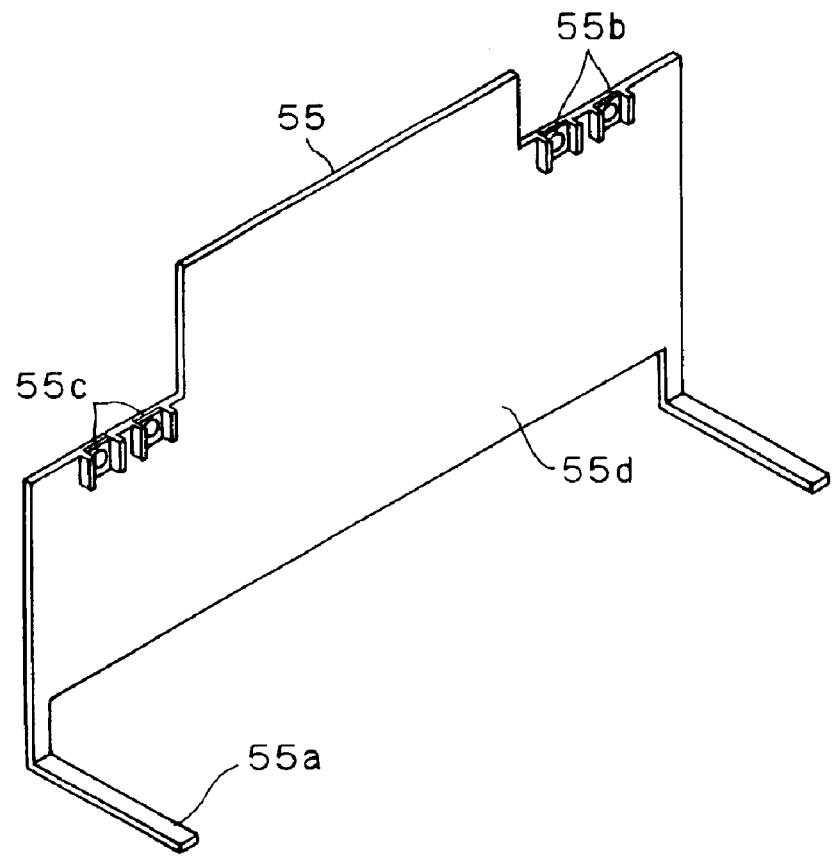
FIG. 5 is a perspective view of the main circuit board of the DC/DC converter of the inverter of the first embodiment.

FIG. 5 is a perspective view of the main circuit board 55. The main circuit board 55 is a molding of resin consisting of a vertical portion 55d and leg portions 55a formed to extend from the lower end of the vertical portion 55d perpendicularly thereto, and is disposed to stand upright with the leg portions 55a fixed to the chassis 34 (see FIG. 3). In the vertical portion 55d of the main circuit board 55, there are provided metal connection portions 55b and 55c having screw holes through which screws are put to fasten the output terminal portion 51 and the input terminal portion 61.

The main circuit board 55 is formed by insert-molding a metal circuit pattern so as to form the leg portions 55a, the connection portions 55b and 55c, and the vertical portion 55d integrally therewith. The circuit pattern is formed by punching it out of a metal plate by stamping or the like, and is arranged on the vertical portion 55d. The leg portions 55a may be molded of resin integrally with the main circuit board 55. The connection portions 55b and 55c are located in positions where they conduct to predetermined portions of the circuit pattern. The vertical portion 55d may be formed as a printed circuit board, with the metal connection portions 55b and 55c and the leg portions 55a fitted firmly thereto.

Figure 6:
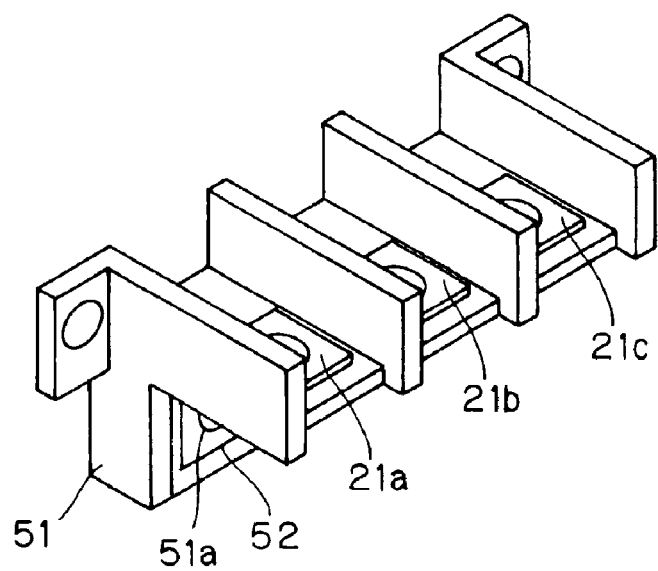
FIG. 6 is a perspective view of the output terminal portion of the DC/DC converter of the inverter of the first embodiment.
Figure 7:
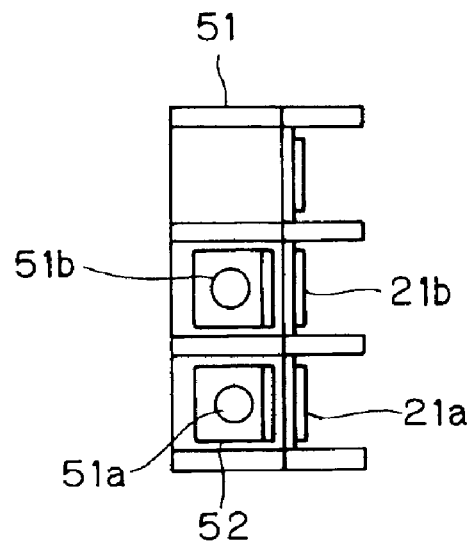
FIG. 7 is a side view of the output terminal portion of the DC/DC converter of the inverter of the first embodiment, showing its fitted state.
Figure 8:
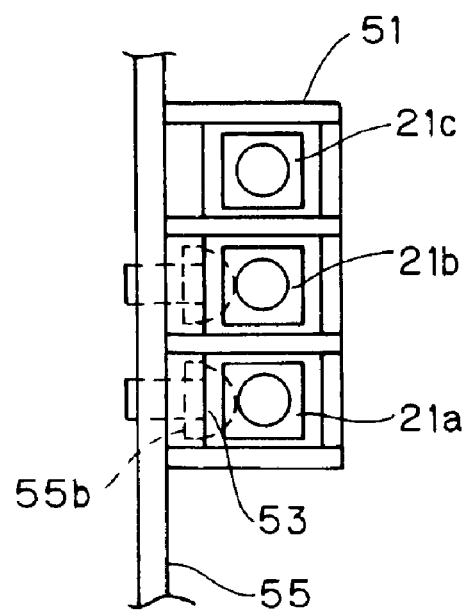
FIG. 8 is a top view of the output terminal portion of the DC/DC converter of the inverter of the first embodiment, showing its fitted state.

FIGS. 6, 7, and 8 are a perspective view, a side view, and a top view, respectively, of the output terminal portion 51. The output terminal portion 51 is a molding of resin having a substantially L-shaped section, and has fitting holes 51a and 51b formed in the surface thereof perpendicular to the surface thereof on which the output terminals 21a and 21b are provided.

The fitting holes 51a and 51b and the output terminals 21a and 21b are made to conduct to each other respectively and form a circuit by insert molding of L-shaped metal plates 52. The output terminal portion 51 (circuit portion) is fitted to the main circuit board 55 by screws 53 put through the fitting holes 51a and 51b. In this way, the circuit pattern formed on the main circuit board 55 is electrically connected to the output terminals 21 and 21b by the screws 53.

Accordingly, there is no need to connect the circuit pattern on the main circuit board 55 to the output terminals 21a and 21b with leads or the like, and thus there is no need to provide terminals for connection of leads. This makes it possible to miniaturize the DC/DC converter 21. In the output terminal portion 51, there is also provided a connection terminal 21c that is disposed next to the output terminal 21b and that is electrically insulated from the main circuit board 55.

As shown in FIG. 3 described earlier, the DC/DC converters 21, 22, and 23, which are arranged side by side, have their output terminals (first output terminals) 21a, 22a, and 23a arranged in a line, have their output terminals (second output terminals) 21b, 22b, and 23b arranged in a different line, and have their connection terminals 21c, 22c, and 23c arranged in a still different line.

The output terminals 21a, 22a, and 23a are connected together by an I-shaped bus bar 31 (first conducting plate) formed of a metal such as copper and fastened thereto with screws. The output terminals 21b, 22b, and 23b are connected together by one linear portion of a U-shaped bus bar 32 (second conducting plate) fastened thereto with screws. The connection terminals 21c, 22c, and 23c are connected together by the other linear portion of the U-shaped bus bar 32 fastened thereto with screws. To the output terminal 21a and the connection terminal 21c, the input-side leads 9 of the DC/AC conversion circuit 3 are connected.

Accordingly, there is no need to connect leads to the output terminals 22a, 23a, 22b, and 23b individually, and it is possible to use the output terminal 21a and the connection terminal 21c as the common terminals of the two poles (first and second common terminals) to facilitate connection to the input side of the DC/AC conversion circuit 3. In this way, electrically connecting the DC/DC converters 21, 22, and 23 results in mechanically fixing them. This eliminates the need to provide a separate portion for mechanical fixing, and thus helps save space. Moreover, it is possible to reduce the trouble and time required for the assembly of the inverter 20.

Moreover, the output terminals 21a, 22a, and 23a have decreasingly long connection distances to the input side of the DC/AC conversion circuit 3, and, as the result of the use of the U-shaped bus bar 32, the output terminals 21b, 22b, and 23b have increasingly long connection distances to the input side of the DC/AC conversion circuit 3. This makes substantially equal the sum of the connection distance from one pole of each of the electrolytic capacitor capacitors 41, 42, and 43 (see FIG. 2) to the input side of the DC/AC conversion circuit 3 and the connection distance from the other pole of the same electrolytic capacitor to the input side of the DC/AC conversion circuit 3.

As a result, even when resistances appear in the bus bars 31 and 32, the electrolytic capacitors 41, 42, and 43 receive equal voltages. This helps make the life times of the electrolytic capacitors 41, 42, and 43 equal so that they have a longer life time as a whole, and thereby enhance the reliability of the inverter 20. In addition, it is possible to omit complicated wiring and thereby save space.

Figure 9:
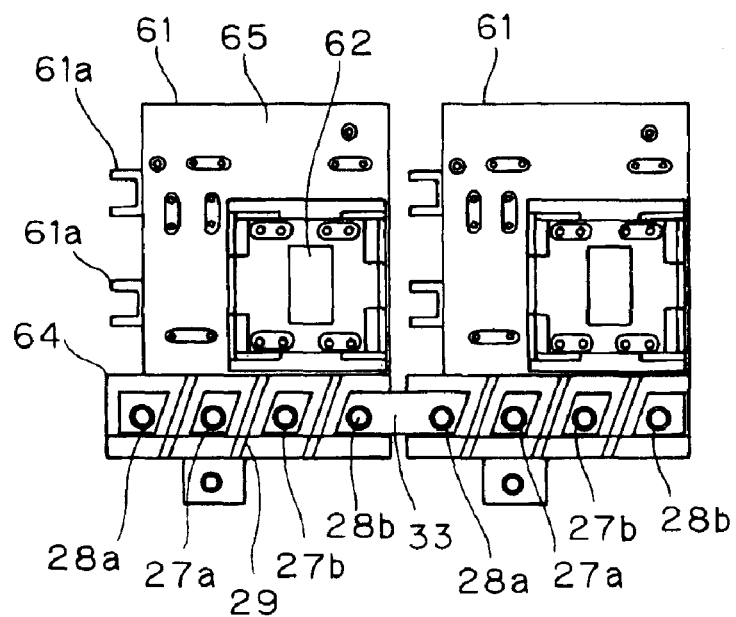
FIG. 9 is a top view of the input terminal portion of the DC/DC converter of the inverter of the first embodiment.

FIG. 9 is a top view of the input terminal portion 61. As shown in this figure and in FIG. 4 described earlier, the input terminal portion 61 is composed of a circuit board 65, an input terminal block 64, and a support potion 63. The circuit board 65 is provided with metal connection portions 61a that connect to the main circuit board 55, and is fitted with a power switch 62 for turning on and off the power to the DC/DC converter 21. A surge absorber or a similar component may be mounted on the circuit board 65.

The input terminal block 64 is provided with input terminals 27a and 27b to which the leads 7 from one of the solar cell arrays 11, 12, and 13 (see FIG. 1) are connected. On both sides of the input terminals 27a and 27b, there are provided ground terminals 28a and 28b that are kept at the same potential. The input terminals 27a and 27b and the ground terminals 28a and 28b are arranged in the direction of the arrangement of the DC/DC converters 21, 22, and 23, which are arranged side by side, and are separated from one another by separation walls 29 formed of resin. The support potion 63, which extends vertically from the circuit board 65, is formed of a metal, and is fixed to a support plate 56 fitted to the leg portion 55a of the main circuit board 55 to support the input terminal portion 61.

The input terminal portion 61 is formed by insert-molding a metal member having the predetermined circuit pattern to be provided on the circuit board 65, the input terminals 27a and 27b, the ground terminals 28a and 28b, the connection portions 61a, and the support portion 63 integrally formed therewith by stamping or the like. This eliminates the need to lay wiring between the circuit board 65 and the input terminal block 64, and thus helps save space for wiring. Moreover, there is no need to assemble together the circuit board 65, the input terminal block 64, and the support potion 63, and thus it is possible to reduce the number of components as well as the trouble and time required for assembly. The support potion 63 may be molded of resin integrally with the circuit board 65.

The separation walls 29 between the input terminals 27a and 27b and the ground terminals 28a and 28b are so formed as to be inclined as seen in a plan view. As a result, even when the DC/DC converters 21, 22, and 23 are arranged close to a wall surface of the chassis 34, it is possible to reduce the degree to which the leads 7 connected to the input terminals 27a and 27b need to be bent. This helps miniaturize the inverter 20 and enhance the reliability of the leads 7.

Since the ground terminals 28a and 28b are provided at both ends of the input terminal portion 61, the ground terminal 28b of the DC/DC converter 21 and the ground terminal 28a of the DC/DC converter 22, which are arranged side by side, are located next to each other and are connected together by a plate-shaped bus bar (conductor plate) 33. Likewise, the ground terminal 28b of the DC/DC converter 22 and the ground terminal 28a of the DC/DC converter 23 are located next to each other and are connected together by a bus bar 33 formed of a metal plate.

Accordingly, simply by connecting a lead 6 to the ground terminal 28a of the DC/DC converter 21, it is possible to ground the DC/DC converters 21, 22, and 23. This helps save the space for the wiring of leads for grounding and thereby miniaturize the inverter 20. Moreover, it is possible to reduce connections and thereby simplify assembly and reduce the trouble and time required for assembly.

Figure 10:
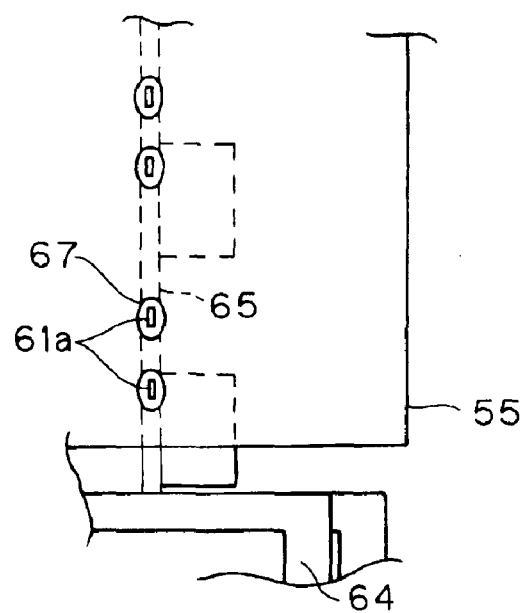
FIG. 10 is a side view of the input terminal portion of the DC/DC converter of the inverter of the first embodiment, showing its fitted state.
Figure 11:
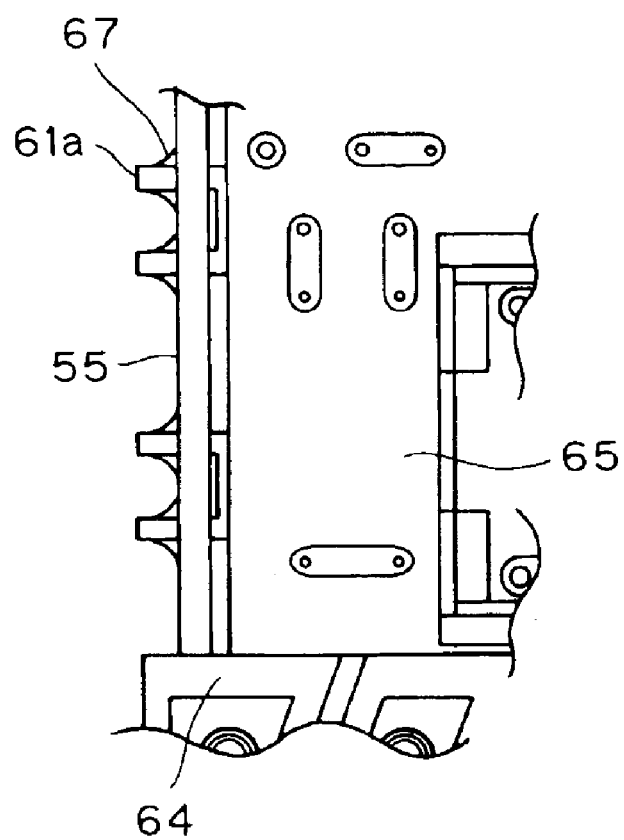
FIG. 11 is a top view of the input terminal portion of the DC/DC converter of the inverter of the first embodiment, showing its fitted state.

FIGS. 10 and 11 are a top view and a side view, respectively, showing the input terminal portion 61 (circuit portion) in its fitted state. The connection portions 61a formed integrally with the circuit board 65 are put through holes (not shown) formed in the main circuit board 55, and are fitted firmly thereto with solder 67. This permits the circuit pattern formed on the main circuit board 55 to conduct to the connection portions 61a, and thereby permits the input terminals 27a and 27b and the ground terminals 28a and 28b to be electrically connected to the circuit pattern.

Accordingly, there is no need to connect the circuit board 65 to the main circuit board 55 with leads or the like, and thus it is possible to reduce the space required for the connection between the main circuit board 55 and the input terminal portion 61. This makes it possible to miniaturize the DC/DC converter 21, 22, and 23 and reduce the trouble and time required for the assembly of the DC/DC converters 21, 22, and 23. The input terminal portion 61 may be fitted with screws through the connection portions 55c (see FIG. 5) so that this fitting portion is shared for mechanical fixing between the main circuit board 55 and the input terminal portion 61.

Next, a second embodiment of the invention will be described with reference to FIGS. 12 to 14. For convenience's sake, such components as are found also in the first embodiment shown in FIGS. 1 to 11 described above are identified with the same reference numerals. This embodiment, like the first embodiment shown in FIG. 1, deals with an inverter for solar light power generation system to which solar cell arrays 11, 12, and 13 composed of solar cell arrays are connected.

Figure 12:
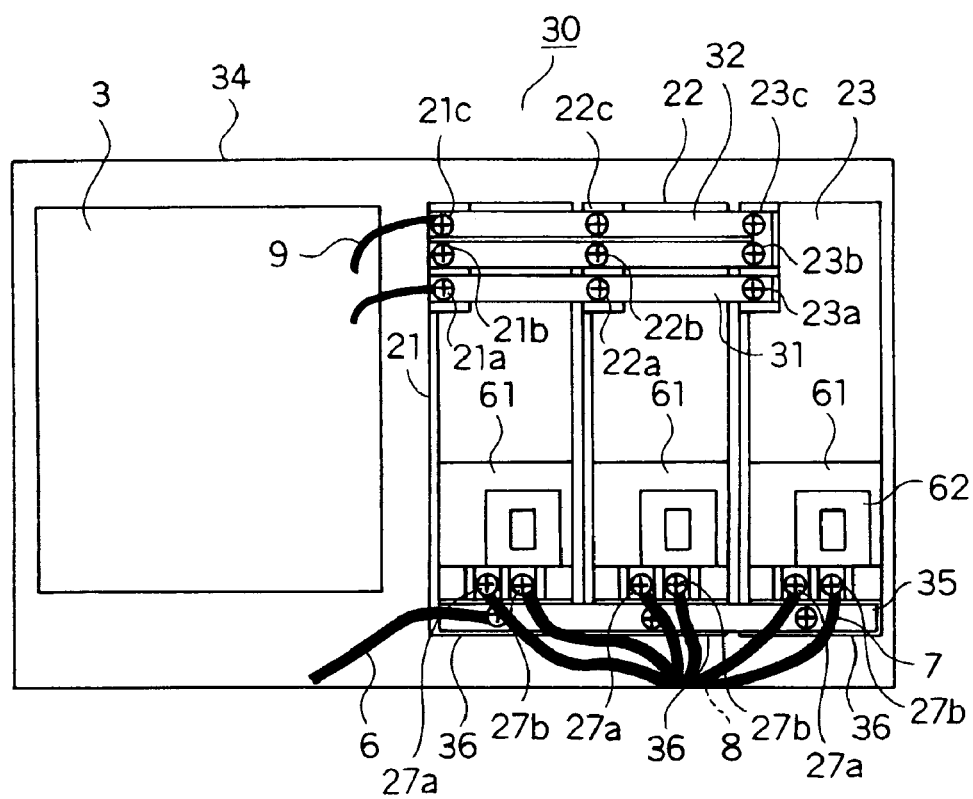
FIG. 12 is a top view of the inverter of a second embodiment of the invention.

FIG. 12 is a top view of the inverter 30. The inverter 30 has a DC/AC conversion circuit 3 arranged in one side of a chassis 34, and has DC/DC converters 21, 22, and 23 arranged side by side in the other side of the chassis 34. Below the DC/AC conversion circuit 3 as seen in the figure, there is provided an input portion 8 having through holes (not shown) formed through the bottom surface of the chassis 34. Through those through holes, leads 7 leading from the solar cell arrays 11, 12, and 13 (see FIG. 1) run into the inverter 30.

Figure 13:
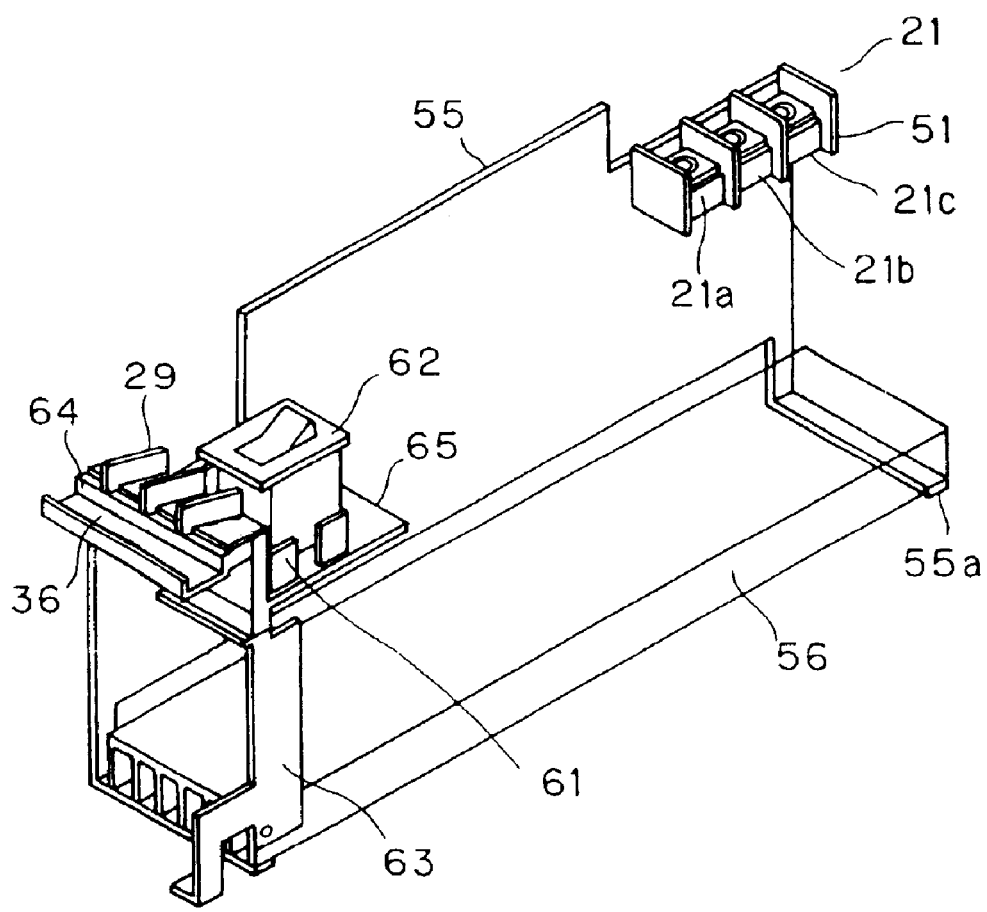
FIG. 13 is a perspective view of the DC/DC converter of the inverter of the second embodiment.

FIG. 13 is a perspective view of the DC/DC converter 21. The DC/DC converters 22 and 23 are structured identically to the DC/DC converter 21. The DC/DC converter 21 has a main circuit board 55 on which its circuit is formed, and, on the main circuit board 55, there are fitted an output terminal portion 51 having output terminals 21a and 21b and an input terminal portion 61 having input terminals 27a and 27b (see FIG. 12).

Figure 14:
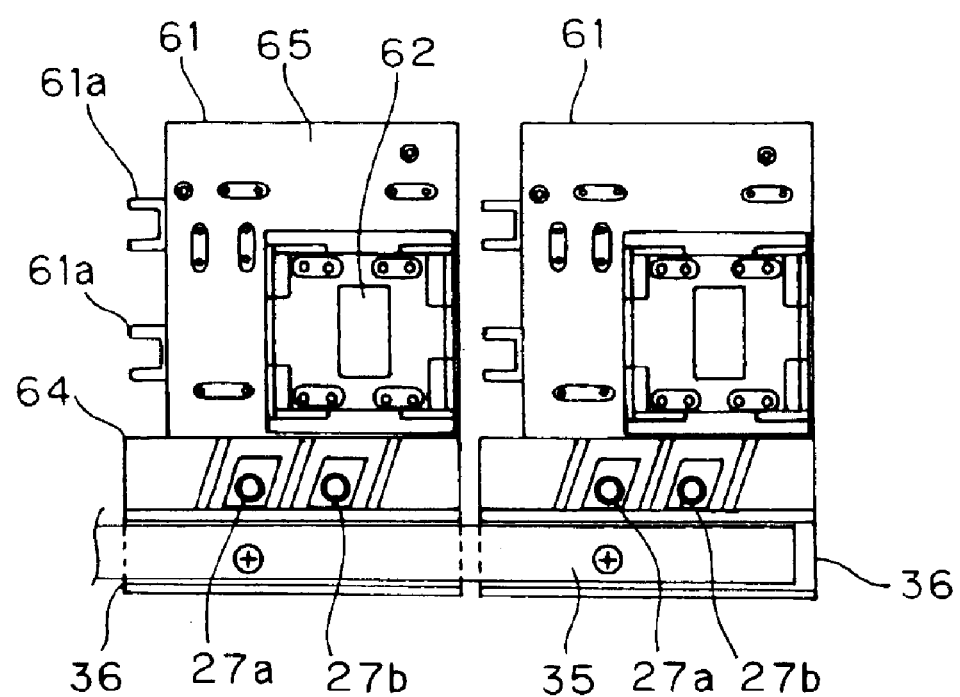
FIG. 14 is a top view of the input terminal portion of the DC/DC converter of the inverter of the second embodiment.

FIG. 14 is a top view of the input terminal portion 61. As shown in this figure and in FIG. 13 described earlier, the input terminal portion 61 is composed of a circuit board 65, an input terminal block 64, and a support potion 63. The circuit board 65 and the support potion 63 are structured in the same manner as in the first embodiment. The input terminal block 64 is provided with input terminals 27a and 27b to which the leads 7 leading from one of the solar cell arrays 11, 12, and 13 (see FIG. 1) are connected. The input terminals 27a and 27b are arranged in a line in the direction of the arrangement of the DC/DC converters 21, 22, and 23, which are arranged side by side, and are separated from one another by separation walls 29 formed of resin.

In a line parallel to but different from the line in which the input terminals 27a and 27b are arranged, there is arranged a ground terminal 36. The ground terminal 36 is so located as to have no obstacle in the direction of the arrangement of the DC/DC converters 21, 22, and 23, which are arranged side by side, and thus the ground terminals 36 of the DC/DC converters 21, 22, and 23 arranged side by side are connected together by a plate-shaped bus bar 35.

Accordingly, as in the first embodiment, simply by connecting a lead 6 (see FIG. 12) to the ground terminal 36 of the DC/DC converter 21, it is possible to ground the DC/DC converters 21, 22, and 23. This helps save the space for the wiring of leads for grounding and thereby miniaturize the inverter 30. Moreover, it is possible to reduce connections and thereby simplify assembly and reduce the trouble and time required for assembly. Furthermore, connecting together the individual ground terminals 36 by a single bus bar 35 helps reduce the number of components.

Figure 15:
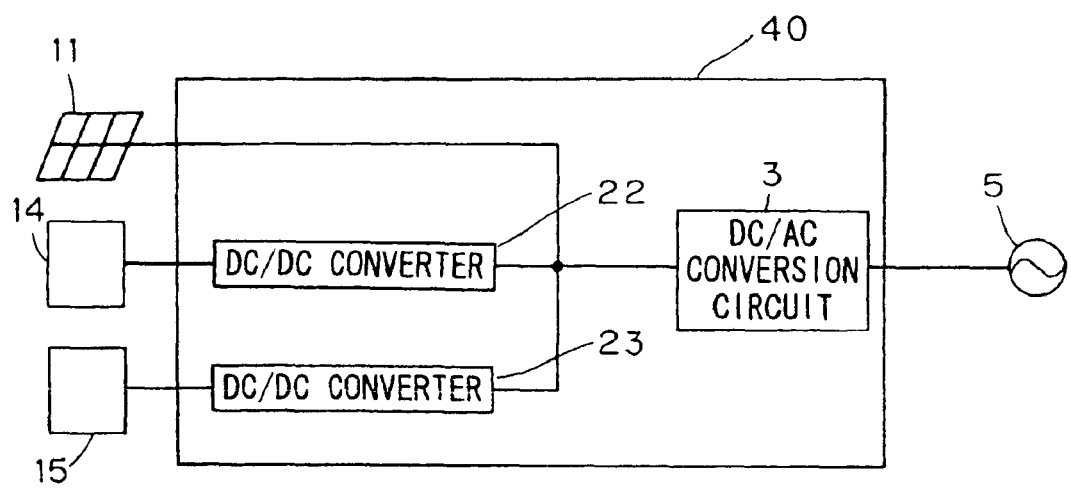
FIG. 15 is a block diagram showing the structure of the inverter of a third embodiment of the invention.

The first and second embodiments described above deal with inverters to which solar cell arrays 11, 12, and 13 are connected. The present invention is applicable, however, also to inverters employing direct-current sources of any other types. For example, FIG. 15 shows the inverter of a third embodiment of the invention. To this inverter 40, there are connected a solar cell array 11, a fuel cell 14, and a rechargeable cell 15.

These direct-current sources output different voltages, and therefore, for the fuel cell 14 and the rechargeable cell 15, DC/DC converters 22 and 23 like those used in the first and second embodiments are provided on the input side of a DC/AC conversion circuit 3. Also in the inverter 40 configured in this way, adopting the same structure as adopted in the first or second embodiment results in achieving the same advantages as achieved in those embodiments.

What is claimed is:

1. An inverter for converting direct-current power output from a direct-current power source into alternating-current power for output, comprising:
   a plurality of DC/DC converters arranged side by side, each having a direct-current power source connected to an input side thereof,
   one pole of a capacitor provided at an output end of each DC/DC converter being connected to a first common terminal in such a way that the DC/DC converters have decreasingly long connection distances in order of arrangement thereof,
   another pole of the capacitor provided at the output end of each DC/DC converter being connected to a second common terminal in such a way that the DC/DC converters have increasingly long connection distances in order of arrangement thereof.

2. An inverter as claimed in claim 1,
   wherein the DC/DC converters each comprise a first output terminal conducting to one pole of the capacitor, a second output terminal conducting to another pole of the capacitor, and a connection terminal disposed next to the second output terminal,
   the first output terminals, second output terminals, and connection terminals of the individual DC/DC converters being arranged in different lines respectively,
   the inverter further comprising a first conductor plate that ties together the first output terminals and a second conductor plate that ties together the second output terminals and that is at one end extended in U shape so as to be tied to at least one of the connection terminals.

3. An inverter as claimed in claim 2,
   wherein the DC/DC converters each comprise a circuit board and a circuit portion tied to the circuit board by a fitting member,
   the circuit board and the circuit portion conducting to each other by way of the fitting member.

4. An inverter for converting direct-current power output from a direct-current power source into alternating-current power for output, comprising:
   a DC/DC converter having a direct-current power source connected to an input side thereof,
   the DC/DC converter comprising a circuit board and a circuit portion tied to the circuit board by a fitting member,
   the circuit board and the circuit portion conducting to each other by way of the fitting member.

5. An inverter for converting direct-current power output from a direct-current power source into alternating-current power for output, comprising:
   a DC/DC converter having a direct-current power source connected to an input side thereof,
   the DC/DC converter comprising a circuit board and a circuit portion tied to the circuit board by a fitting member,
   the circuit board or the circuit portion being formed by insert molding.

6. An inverter as claimed in claim 5,
   wherein a terminal block having an input terminal and a ground terminal or a support portion for supporting the circuit board is formed integrally with the circuit board.

7. An inverter for converting direct-current power output from a direct-current power source into alternating-current power for output, comprising:
   a plurality of DC/DC converters arranged side by side, each having a direct-current power source connected to an input side thereof
   the DC/DC converters comprising ground terminals and input terminals arranged in a direction of arrangement thereof, with the ground terminals of each DC/DC converter arranged on both sides of the input terminals thereof,
   one ground terminal of one DC/DC converter being tied to another ground terminal of a next DC/DC converter by a conductor plate.

8. An inverter for converting direct-current power output from a direct-current power source into alternating-current power for output, comprising:
   a plurality of DC/DC converters arranged side by side, each having a direct-current power source connected to an input side thereof,
   the DC/DC converters comprising ground terminals and input terminals separated from one another by separation walls inclined with respect to a direction of arrangement thereof.

9. An inverter for converting direct-current power output from a direct-current power source into alternating-current power for output, comprising:
   a plurality of DC/DC converters arranged side by side, each having a direct-current power source connected to an input side thereof,
   the DC/DC converters comprising ground terminals and input terminals arranged respectively in two different lines parallel to a direction of arrangement thereof,
   the ground terminals of adjacent DC/DC converters being tied together with a plate-shaped conductor plate.

* * * * *